US011132947B2

(12) United States Patent
Feng et al.

(10) Patent No.: US 11,132,947 B2
(45) Date of Patent: Sep. 28, 2021

(54) OLED DISPLAY SUBSTRATE AND OLED DISPLAY APPARATUS

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN); Yubao Kong, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/914,485

(22) Filed: Jun. 29, 2020

(65) Prior Publication Data

US 2021/0043137 A1 Feb. 11, 2021

(30) Foreign Application Priority Data

Aug. 9, 2019 (CN) .......................... 201910735224.X (51) Int. Cl.
*G09G 5/00* (2006.01)
*G09G 3/3225* (2016.01)
(Continued)

(52) U.S. Cl.
CPC ......... *G09G 3/3225* (2013.01); *G09G 3/3208* (2013.01); *G09G 3/3258* (2013.01);
(Continued)

(58) Field of Classification Search
CPC .. G09G 3/3225; G09G 3/3258; G09G 3/3208; G09G 2300/0408; G09G 2300/0852; G09G 2310/0286; G11C 19/28
See application file for complete search history.

(56) References Cited

U.S. PATENT DOCUMENTS

| 5,940,059 A | 8/1999 | Lee et al. |
| 2003/0086048 A1 | 5/2003 | Ukita |
| 2013/0278567 A1* | 10/2013 | Chang .................. G09G 3/3677 345/204 |

(Continued)

FOREIGN PATENT DOCUMENTS

| CN | 1416001 A | 5/2003 |
| CN | 101071245 A | 11/2007 |

(Continued)

OTHER PUBLICATIONS

Office Action dated May 25, 2020 for Chinese Patent Application No. 201910735224.X and English Translation.

(Continued)

*Primary Examiner* — Adam J Snyder
(74) *Attorney, Agent, or Firm* — Ling Wu; Stephen Yang; Ling and Yang Intellectual Property (57) ABSTRACT

Disclosed is a display substrate and a display apparatus, the display substrate includes a display area and a peripheral area, wherein the display substrate includes M groups of shift registers and N groups of clock signal lines in the peripheral area, M is greater than or equal to N, M and N are positive integers, each group of shift registers is connected with a group of gate lines positioned in the display area, and adjacent N groups of shift registers are connected with N groups of clock signal lines one by one correspondingly. The N groups of clock signal lines are disposed side by side along a first direction, and configured to make, through an adjustment of a wiring sequence, an impedance difference between two groups of clock signal lines connected to any two adjacent groups of shift registers be less than or equal to an impedance threshold value.

6 Claims, 6 Drawing Sheets

(51) Int. Cl.
    *G09G 3/3258* (2016.01)
    *G09G 3/3208* (2016.01)
    *G11C 19/28* (2006.01)
(52) U.S. Cl.
    CPC ........... *G09G 2300/0408* (2013.01); *G09G 2300/0852* (2013.01); *G09G 2310/0286* (2013.01); *G11C 19/28* (2013.01)

(56) References Cited

U.S. PATENT DOCUMENTS

| | | | |
|---|---|---|---|
| 2014/0333592 A1 | 11/2014 | Cho et al. | |
| 2016/0335949 A1* | 11/2016 | Lin | G09G 3/3677 |
| 2016/0372024 A1 | 12/2016 | Lim et al. | |
| 2017/0124972 A1* | 5/2017 | Kim | G09G 3/3677 |
| 2018/0005582 A1 | 1/2018 | Takahara | |

FOREIGN PATENT DOCUMENTS

| | | |
|---|---|---|
| CN | 101667388 A | 3/2010 |
| CN | 101777301 A | 7/2010 |
| CN | 201716962 U | 1/2011 |
| CN | 103198802 A | 7/2013 |
| CN | 105161042 A | 12/2015 |
| CN | 105761662 A | 7/2016 |
| CN | 106297680 A | 1/2017 |
| CN | 108490708 A | 9/2018 |
| CN | 109272921 A | 1/2019 |

OTHER PUBLICATIONS

Office Action dated Jul. 9, 2020 for Chinese Patent Application No. 201910735224.X and English Translation.

* cited by examiner

OLED DISPLAY SUBSTRATE AND OLED DISPLAY APPARATUS

CROSS-REFERENCE TO RELATED APPLICATION

The present application claims the priority of Chinese patent application No. 201910735224.X, filed to the CNIPA on Aug. 9, 2019, the content of which is hereby incorporated by reference.

TECHNICAL FIELD

Embodiments of the present disclosure relate to, but are not limited to, the technical field of display, in particular to a display substrate and a display apparatus.

BACKGROUND

Organic Light-Emitting Diode (OLED) is currently one of hotspots in a research field of flat panel display, has advantages such as power saving, ultra-thin thickness, light weight, self-luminescence, no visual angle limitation, fast reaction speed, high photoelectric efficiency, no need of a backlight structure and a color filter structure, high contrast, high luminance efficiency, high brightness, multi-color and color (RGB) component manufacturing capability, a wide range of usage temperature, etc., and has been widely applied in display fields such as mobile phones, flat panel computers, digital cameras, etc.

An OLED display panel includes: a pixel driving circuit and a Gate Driver on Array (GOA) circuit, wherein the GOA circuit is used for providing a scanning signal for the pixel driving circuit, and the pixel driving circuit is used for driving an OLED in the OLED display panel to emit light to realize display. The GOA circuit includes: multiple shift registers, wherein each shift register is used for providing a scanning signal to a row of the pixel driving circuit.

SUMMARY

The following is a summary of the subject matter of the present disclosure described in detail. The summary is not intended to limit a protection scope of the claims.

An embodiment of the present disclosure provides a display substrate. The display substrate includes a display area and a peripheral area, wherein the display substrate includes M groups of shift registers and N groups of clock signal lines in the peripheral area, M is greater than or equal to N, M and N are positive integers, each group of shift registers is connected with a group of gate lines positioned in the display area, and adjacent N groups of shift registers are connected with N groups of clock signal lines one by one correspondingly. The N groups of clock signal lines are disposed side by side along a first direction, and the N groups of clock signal lines are configured to make, through an adjustment of a wiring sequence, an impedance difference between two groups of clock signal lines connected to any two adjacent groups of shift registers be less than or equal to an impedance threshold value.

In an exemplary embodiment, the impedance threshold value is $2*\Delta R$, $\Delta R$ is an impedance difference between two groups of clock signal lines connected to two adjacent groups of shift registers.

In an exemplary embodiment, each group of shift registers includes a first shift register, each group of clock signal lines includes a first clock signal line, N first clock signal lines are positioned on one side of the M first shift registers away from the display area, and adjacent N first shift registers are connected with N first clock signal lines one by one correspondingly. A wiring sequence of the N first clock signal lines satisfies that the impedance difference between an i-th first clock signal line and an (i+1)-th first clock signal line, a first first clock signal line and a N-th first clock signal line is $\Delta R$ or $2*\Delta R$ respectively, i is an integer between 1 and N−1.

In an exemplary embodiment, the first direction is a direction close to the first shift register, and when N is an even number, a wiring sequence of the N first clock signal lines along the first direction is sequentially: the first first clock signal line, a second first clock signal line, the N-th first clock signal line, a third first clock signal line, a (N−1)-th first clock signal line, ..., $$a\frac{N}{2}\text{-}th \text{ first clock signal line,}$$

$$a\left(\frac{N}{2}+2\right)\text{-}th \text{ first clock signal line,}$$

$$a\left(\frac{N}{2}+1\right)\text{-}th \text{ first clock signal line.}$$

In another exemplary embodiment, the first direction is a direction close to the first shift register, and when N is an even number, a wiring sequence of the N first clock signal lines along the first direction is sequentially: the first first clock signal line, the N-th first clock signal line, a second first clock signal line, a (N−1)-th first clock signal line, a third first clock signal line, ..., $$a\left(\frac{N}{2}+2\right)\text{-th first clock signal line, } a\frac{N}{2}\text{-th first clock signal line,}$$

$$a\left(\frac{N}{2}+1\right)\text{-th first clock signal line.}$$

In an exemplary embodiment, the first direction is a direction close to the first shift register, and when N is an odd number, a wiring sequence of the N first clock signal lines along the first direction is sequentially: the first first clock signal line, a second first clock signal line, the N-th first clock signal line, a third first clock signal line, the (N−1)-th first clock signal line, ..., $$a\left(\frac{N+1}{2}+2\right)\text{-th first clock signal line,}$$

$$a\frac{N+1}{2}\text{-th first clock signal line,}$$

$$a\left(\frac{N+1}{2}+1\right)\text{-th first clock signal line.}$$

In another exemplary embodiment, the first direction is a direction close to the first shift register, and when N is an odd number, a wiring sequence of the N first clock signal lines along the first direction is sequentially: the first first clock signal line, the N-th first clock signal line, a second first clock signal line, a (N−1)-th first clock signal line, a third first clock signal line, ..., $a\left(\dfrac{N+1}{2}-1\right)$-th first clock signal line, $a\left(\dfrac{N+1}{2}+1\right)$-th first clock signal line, $a\dfrac{N+1}{2}$-th first clock signal line.

In an exemplary embodiment, each group of shift registers includes a first shift register and a second shift register, and each group of clock signal lines includes a first clock signal line and a second clock signal line. N first clock signal lines are positioned on one side of the M first shift registers away from the display area, adjacent N first shift registers are connected with N first clock signal lines one by one correspondingly, and the first shift register and the second shift register in the same group of shift registers are connected to the same group of gate lines. N second clock signal lines are positioned on one side of the M second shift registers away from the display area, and adjacent N second shift registers are connected with N second clock signal lines one by one correspondingly. A wiring sequence of the N first clock signal lines and the N second clock signal lines satisfies that a sum of impedances of the first clock signal line and the second clock signal line connected to each group of shift registers is equal to $(N-1)*\Delta R+2*R1$, R1 is an impedance value of a clock signal line closest to the first shift register or the second shift register.

In an exemplary embodiment, signals of the first clock signal line and the second clock signal line in a same group of clock signal lines are same.

In an exemplary embodiment, a wiring sequence of the N first clock signal lines and the N second clock signal lines is: the N first clock signal lines and the N second clock signal lines are respectively positioned in non-display areas on two opposite sides of the display area, the N first clock signal lines are sequentially wired in turn from a direction away from the display area to a direction close to the display area according to the first first clock signal line to the N-th first clock signal line, and the N second clock signal lines are sequentially wired in turn from a direction close to the display area to a direction away from the display area according to the first second clock signal line to the N-th second clock signal line.

An embodiment of the present disclosure further provides a display apparatus. The display apparatus includes a display substrate as described in any one of the above embodiments.

Other aspects will become apparent upon reading and understanding the brief description of the drawings and the embodiments of the present disclosure.

BRIEF DESCRIPTION OF DRAWINGS

Accompanying drawings are used for providing understanding of technical solutions of embodiments of the present disclosure, form a part of the specification, and explain technical solutions of the present disclosure together with embodiments of the present disclosure, and do not constitute a limitation on the technical solutions of the embodiments of the present disclosure.

DETAILED DESCRIPTION

The present disclosure describes multiple embodiments, but the description is exemplary rather than limiting, and it is apparent for those of ordinary skill in the art that, there may be more embodiments and implementations within a scope of the embodiments described in the present disclosure. Although many possible combinations of features are shown in the accompanying drawings, and discussed in the specific implementations, many other combination modes of the disclosed features are also possible. Unless specifically limited, any feature or element of any embodiment may be used in combination with or in place of any other feature or element of any other embodiment.

The present disclosure includes and contemplates combinations of features and elements known to those of ordinary skill in the art. Embodiments, features and elements already disclosed in the present disclosure may also be combined with any conventional feature or element to form a unique inventive solution defined by the claims. Any feature or element of any embodiment may also be combined with a feature or an element from another inventive solution to form another unique inventive solution defined by the claims. Therefore, it should be understood that any of the features shown or discussed in the present disclosure may be implemented individually or in any suitable combination. Therefore, the embodiments are not limited except by the limitations made according to the appended claims and their equivalents. In addition, various modifications and changes may be made within the scope of protection of the appended claims.

In addition, when a representative embodiment is described, the specification may have presented a method or a process as a specific sequence of acts. However, to the extent that the method or the process does not depend on the specific sequence of the acts described in the present disclosure, the method or the process should not be limited to the described acts of the specific sequence. As one of ordinary skill in the art will understand, other sequences of acts are also possible. Therefore, a specific sequence of acts set forth in the specification should not be interpreted as a limitation on the claims. In addition, the claims of the method or the process should not be limited to performing their acts in a written sequence, and those skilled in the art may easily understand that these sequences may be varied and still remain within the spirit and the scope of the embodiments of the present disclosure.

Figure 1:
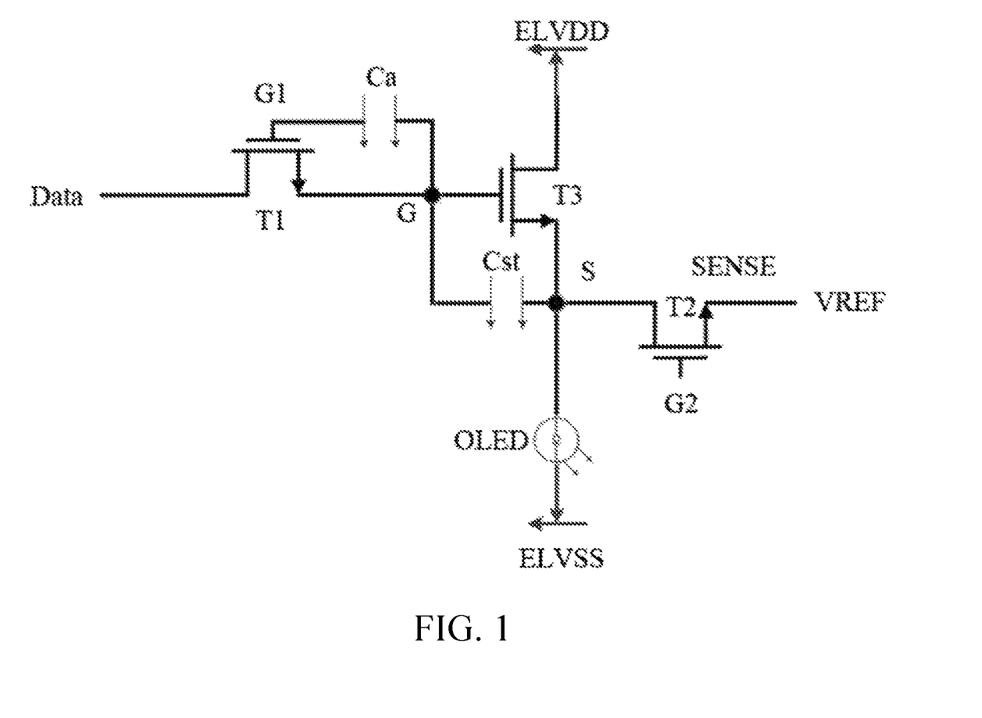
FIG. 1 is a schematic diagram of a pixel driving circuit.

FIG. 1 is an equivalent circuit diagram of a pixel driving circuit. As shown in FIG. 1, the pixel driving circuit includes: a first transistor T1, a second transistor T2, a third transistor T3, a first Capacitor Ca and a second capacitor Cst, wherein T1 and T2 are switching transistors, T3 is a driving transistor, the first capacitor Ca is a coupling capacitor, and the second capacitor Cst is a storage capacitor. A gate of the first transistor T1 connects to a first control signal end G1, a source of the first transistor T1 connects to a data signal end DATA, and a drain of the first transistor T1 is connected with a node G. One end of the first capacitor Ca is connected with the first control signal end G1, and another end of the first capacitor Ca is connected with the node G. One end of the second capacitor Cst is connected with the node G, and another end of the second capacitor Cst is connected with a node S. A gate of the second transistor T2 connects to a second control signal end G2, a drain of the second transistor T2 is connected with the node S, and a source of the second transistor T2 connects to a sensing signal end SENSE. A gate of the third transistor T3 is connected with the node G, a drain of the third transistor T3 connects to a power supply signal end ELVDD, and a source of the third transistor T3 connects to an anode of an Organic Light-Emitting Diode (OLED), and a cathode of the Organic Light-Emitting Diode (OLED) connects to a signal common end ELVSS.

An operation process of the pixel driving circuit includes: providing an effective level to the first control signal end G1 and the second control signal end G2, so that the first transistor T1 and the second transistor T2 are turned onto provide and a signal of the data signal end DATA to the node G and a signal, of which voltage value is reference voltage, provided by the sensing signal end SENSE to the node S respectively, then providing an invalid level to the first control signal end G1 and the second control signal end G2, so that the first transistor T1 and the second transistor T2 are turned off, and the third transistor T3 is turned on to provide driving current to the OLED to drive the OLED to emit light.

In this process, when providing the invalid level to the first control signal end G1, there is coupling between the first capacitor Ca and the second capacitor Cst, so that a change amount $\Delta Vp$ of a potential of the node G satisfies $\Delta Vp=\Delta V1*Cst/(Cst+Ca)$. However, at the same time, $\Delta Vp$ is further affected by a falling edge of a signal of the first control signal end G1, and the larger the falling edge of the signal of the first control signal end G1 is, the smaller $\Delta Vp$ is.

Figure 2:
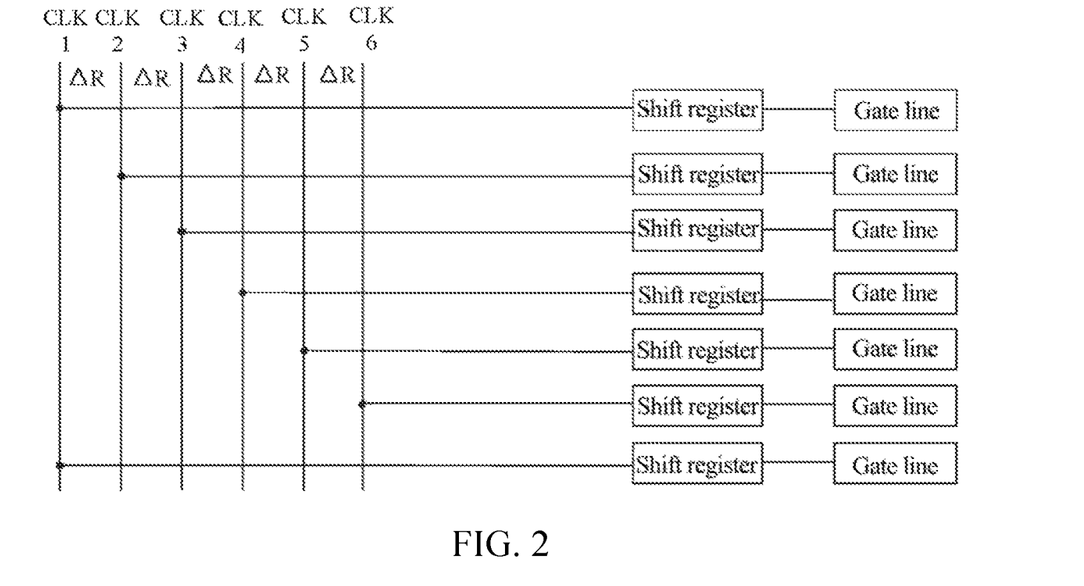
FIG. 2 is a schematic diagram of clock signal line arrangement of a display substrate.

A display substrate includes: multiple shift registers, wherein each shift register provides a scanning signal to a row of a pixel driving circuit, each row of the pixel driving circuit is connected to one or more gate lines. In a large-size OLED, multiple clock signal lines will be usually used to be connected with a gate driving circuit due to power consumption and reliability considerations, and impedance differences between clock signal lines, which are connected to adjacent shift registers during wiring, are different due to a large quantity of the clock signal lines, so that a difference of falling edges of signals of a first control signal end G1 occurs to affect $\Delta Vp$, which further causes the display panel to exhibit periodic horizontal stripes related to the clock signal lines. In FIG. 2, six clock signal ends are taken as an example for illustration. A difference between a clock signal line CLK6 connected to a shift register of a sixth stage and a clock signal line CLK1 connected to a shift register of a seventh stage is $5*\Delta R$, wherein $\Delta R$ is an impedance difference between adjacent clock signal lines in a wiring space.

Thus, a dividing line caused by a brightness difference is generated at a junction of corresponding rows of the clock signal line CLK1 and the clock signal line CLK6, i.e., periodic horizontal stripes are generated in the display panel, affecting a display effect of the display panel.

As shown in FIG. 3, FIG. 4, FIG. 7, FIG. 8 or FIG. 9, a display substrate according to an embodiment of the present disclosure includes a display area and a peripheral area. The display substrate includes M groups of shift registers and N groups of clock signal lines in the peripheral area, M is greater than or equal to N, M and N are positive integers. Each group of shift registers is connected with a group of gate lines positioned in the display area, and adjacent N groups of shift registers are connected with N groups of clock signal lines one by one correspondingly.

The N groups of clock signal lines are disposed side by side along a first direction, and the N groups of clock signal lines are configured to make, through an adjustment of a wiring sequence, an impedance difference between two groups of clock signal lines connected to any two adjacent groups of shift registers be less than or equal to an impedance threshold value.

The display substrate according to the embodiment of the present disclosure effectively eliminates periodic horizontal stripes generated by the display panel and improves the display effect.

In an exemplary embodiment, the impedance threshold value is $2*\Delta R$, $\Delta R$ is an impedance difference between two groups of clock signal lines connected to two adjacent groups of shift registers, i.e., an impedance difference caused by different distances between adjacent clock signal lines in a wiring space and different shift registers.

In an exemplary embodiment, as shown in FIG. 3, FIG. 4, FIG. 7 or FIG. 8, each group of shift registers includes a first shift register, each group of clock signal lines includes a first clock signal line, N first clock signal lines are positioned on one side of M first shift registers away from a display area, and adjacent N first shift registers are connected with the N first clock signal lines one by one correspondingly.

A wiring sequence of the N first clock signal lines satisfies that an impedance difference between an i-th first clock signal line and an (i+1)-th first clock signal line, a first first clock signal line and a N-th first clock signal line is $\Delta R$ or $2*\Delta R$ respectively, i is an integer between 1 and N−1.

For a small-size Flat Panel Display (FPD) product, due to a smaller load on gate lines, cross driving of shift registers may be generally used, i.e., shift registers on one side drive odd-numbered row gate lines, shift registers on the other side drive even-numbered row gate lines, and the left and the right do not interfere with each other and are staggered in time to achieve an effect of sequentially opening the gate lines, which is called single-sided driving, so a frame width and power consumption may be saved.

In the above technology, a first first clock signal line CLK1 is connected to shift registers of a first stage, a (N+1)-th stage, a (2N+1)-th stage, a (3N+1)-th stage, . . . , etc., and a second first clock signal line CLK2 is connected to shift registers of a second stage, a (N+2)-th stage, a (2N+2)-th stage, a (3N+2)-th stage, . . . , etc., a third first clock signal line CLK3 is connected to shift registers of a third stage, a (N+3)-th stage, a (2N+3)-th stage, a (3N+3)-th stage, . . . , etc., . . . , and a N-th first clock signal line CLKN is connected to shift registers of a N-th stage, a 2N-th stage, a 3N-th stage, a 4N-th stage, . . . etc.

According to the display substrate according to the embodiment of the present disclosure, a wiring sequence of the clock signal lines CLKs is no longer arranged according to a regular CLK1-CLKN sequence, and a resistance difference of adjacent clock signal lines CLKs is made not more than 2*ΔR, and such difference is beyond a brightness change which may be felt by human eyes. This method is more effective for multi-output CLKs of high resolution and high Pixels Per Inch (PPI).

In an exemplary embodiment, the first direction is a direction close to the first shift register.

Figure 3:
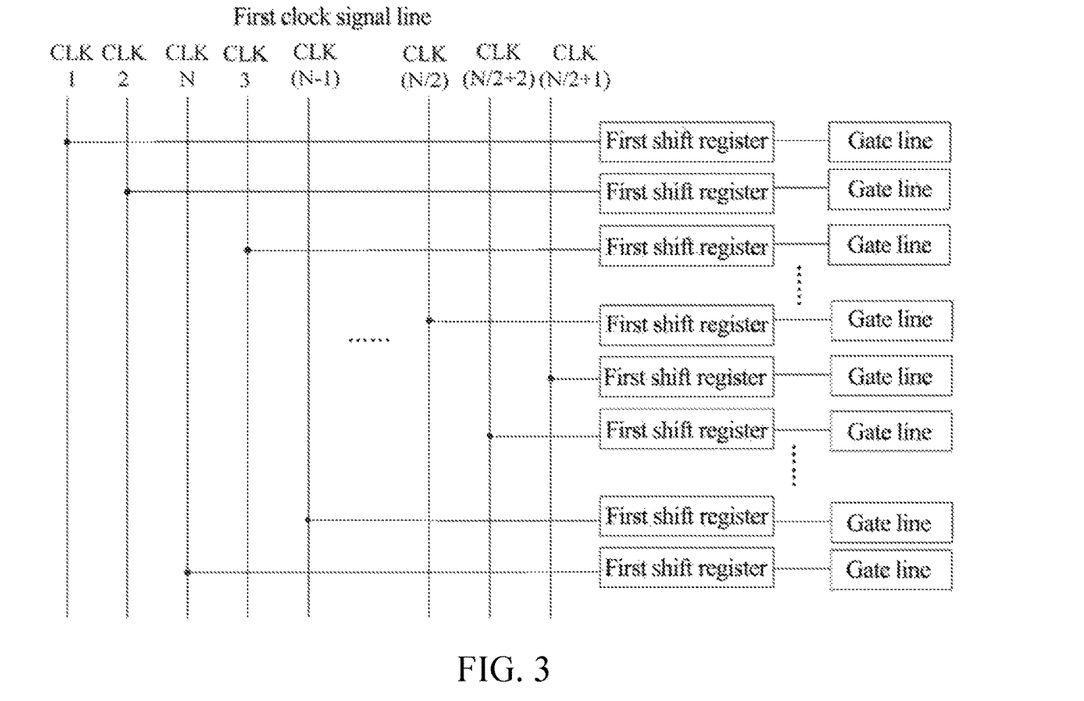
FIG. 3 is a first schematic diagram of clock signal line wiring of a display substrate according to an embodiment of the present disclosure.

In an exemplary embodiment, when N is an even number, a wiring sequence of the N first clock signal lines CLK1~CLKN along the first direction may sequentially be: the first first clock signal line CLK1, the second first clock signal line CLK2, the N-th first clock signal line CLKN, the third first clock signal line CLK3, a (N−1)-th first clock signal line CLK (N−1), . . . , $a\left(\frac{N}{2}\right)$-th first clock signal line $CLK\left(\frac{N}{2}\right)$, $a\left(\frac{N}{2}+2\right)$-th first clock signal line $CLK\left(\frac{N}{2}+2\right)$, and $a\left(\frac{N}{2}+1\right)$-th first clock signal line $CLK\left(\frac{N}{2}+1\right)$, as shown in FIG. 3.

Figure 4:
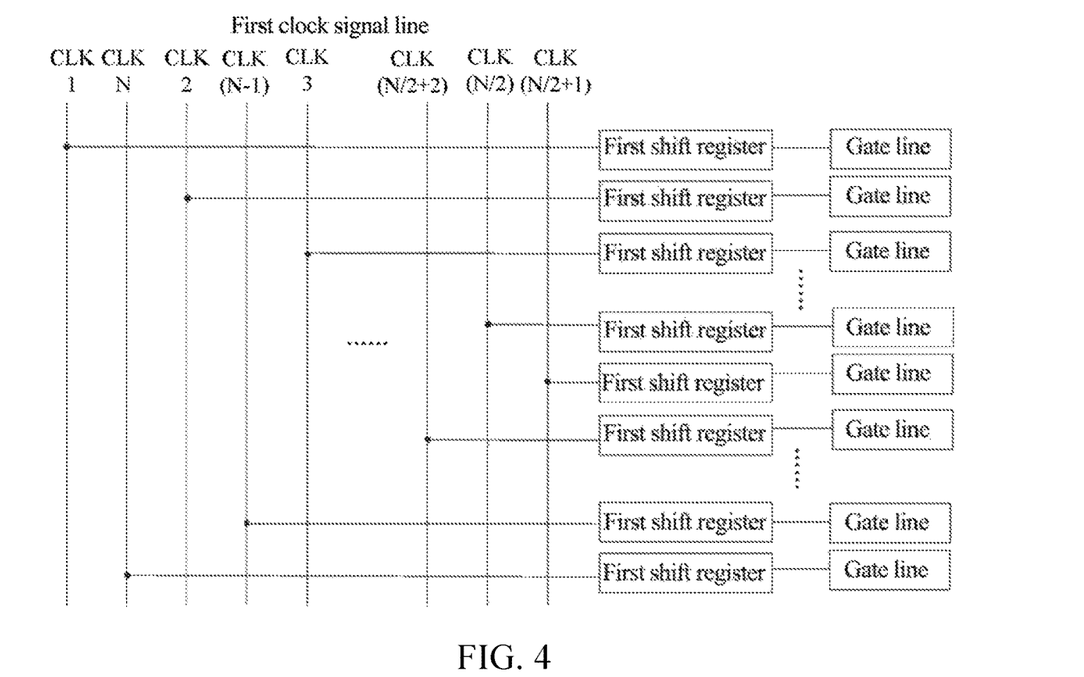
FIG. 4 is a second schematic diagram of clock signal line wiring of a display substrate according to an embodiment of the present disclosure.

In another exemplary embodiment, when N is an even number, a wiring sequence of the N first clock signal lines CLK1~CLKN along the first direction may sequentially be: the first first clock signal line CLK1, the N-th first clock signal line CLKN, the second first clock signal line CLK2, the (N−1)-th first clock signal line CLK(N−1), the third first clock signal line CLK3, . . . , the $\left(\frac{N}{2}+2\right)$-th first clock signal line $CLK\left(\frac{N}{2}+2\right)$, the $\left(\frac{N}{2}\right)$-th first clock signal line $CLK\left(\frac{N}{2}\right)$, and the $\left(\frac{N}{2}+1\right)$-th first clock signal line $CLK\left(\frac{N}{2}+1\right)$, as shown in FIG. 4.

Figure 5:
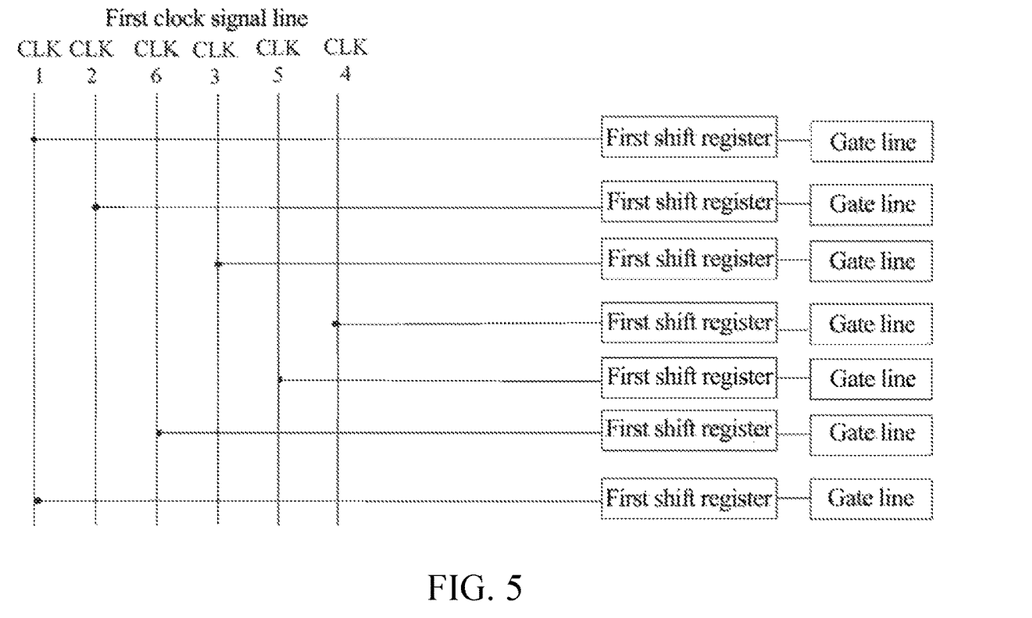
FIG. 5 is a third schematic diagram of clock signal line wiring of a display substrate according to an embodiment of the present disclosure.
Figure 6:
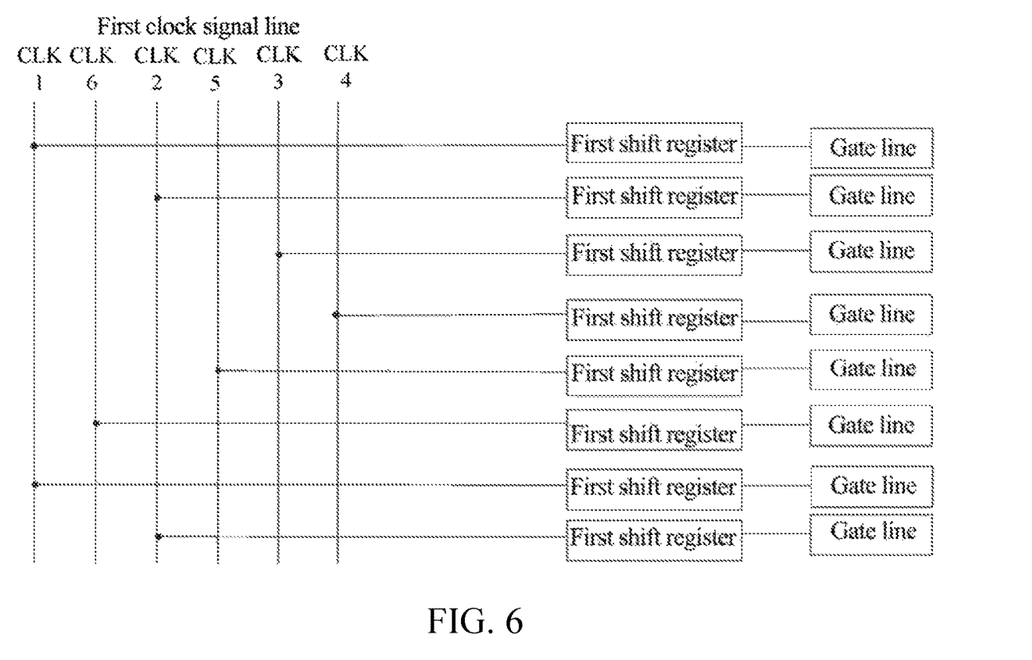
FIG. 6 is a fourth schematic diagram of clock signal line wiring of a display substrate according to an embodiment of the present disclosure.

Illustratively, when N is 6, as shown in FIG. 5, a wiring sequence of six first clock signal lines along the first direction may sequentially be: a first first clock signal line CLK1, a second first clock signal line CLK2, a sixth first clock signal line CLK6, a third first clock signal line CLK3, a fifth first clock signal line CLK5, and a fourth first clock signal line CLK4; or, as shown in FIG. 6, a wiring sequence of six first clock signal lines along the first direction may sequentially be: a first first clock signal line CLK1, a sixth first clock signal line CLK6, a second first clock signal line CLK2, a fifth first clock signal line CLK5, a third first clock signal line CLK3, and a fourth first clock signal line CLK4.

When N is 10, a wiring sequence of ten first clock signal lines along the first direction may sequentially be: a first first clock signal line CLK1, a second first clock signal line CLK2, a tenth first clock signal line CLK10, a third first clock signal line CLK3, a ninth first clock signal line CLK9, a fourth first clock signal line CLK4, an eighth first clock signal line CLK8, a fifth first clock signal line CLK5, a seventh first clock signal line CLK7, and a sixth first clock signal line CLK6; or, a wiring sequence of ten first clock signal lines along the first direction may sequentially be: a first first clock signal line CLK1, a tenth first clock signal line CLK10, a second first clock signal line CLK2, a ninth first clock signal line CLK9, a third first clock signal line CLK3, an eighth first clock signal line CLK8, a fourth first clock signal line CLK4, a seventh first clock signal line CLK7, a fifth first clock signal line CLK5, and a sixth first clock signal line CLK6.

When N is 4, a wiring sequence of four first clock signal lines along the first direction may sequentially be: a first first clock signal line CLK1, a second first clock signal line CLK2, a fourth first clock signal line CLK4, and a third first clock signal line CLK3; or, a wiring sequence of four first clock signal lines along the first direction may sequentially be: a first first clock signal line CLK1, a fourth first clock signal line CLK4, a second first clock signal line CLK2, and a third first clock signal line CLK3.

Figure 7:
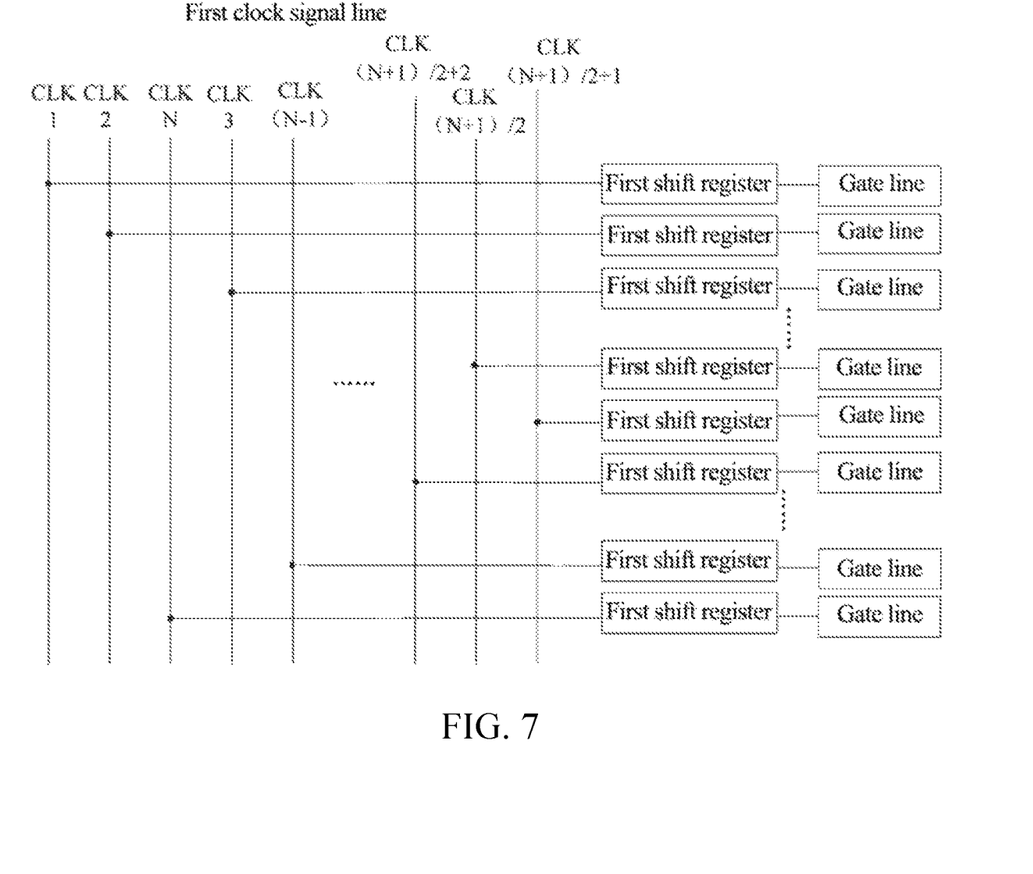
FIG. 7 is a fifth schematic diagram of clock signal line wiring of a display substrate according to an embodiment of the present disclosure.

In an exemplary embodiment, when N is an odd number, as shown in FIG. 7, a wiring sequence of N first clock signal lines CLK1~CLKN along the first direction may sequentially be: a first first clock signal line CLK1, a second first clock signal line CLK2, a N-th first clock signal line CLKN, a third first clock signal line CLK3, a (N−1)-th first clock signal line CLK (N−1), . . . , $a\left(\frac{N+1}{2}+2\right)$-th first clock signal line $CLK\left(\frac{N+1}{2}+2\right)$, $a\left(\frac{N+1}{2}\right)$-th first clock signal line $CLK\left(\frac{N+1}{2}\right)$, and $a\left(\frac{N+1}{2}+1\right)$-th first clock signal line $CLK\left(\frac{N+1}{2}+1\right)$.

Figure 8:
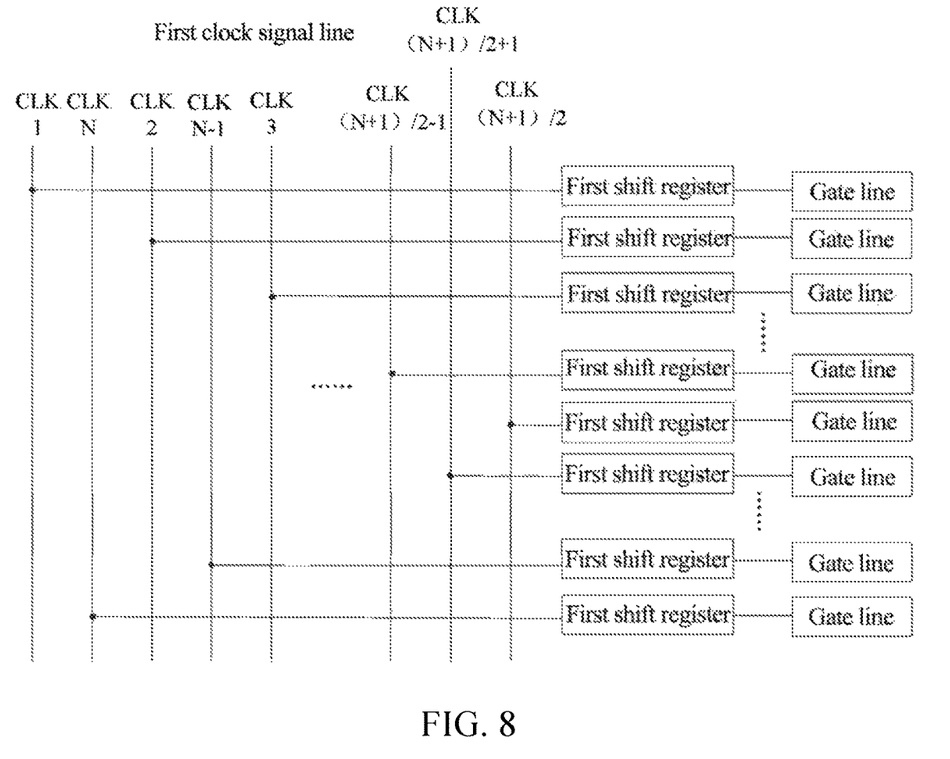
FIG. 8 is a sixth schematic diagram of clock signal line wiring of a display substrate according to an embodiment of the present disclosure.

In another exemplary embodiment, when N is an odd number, as shown in FIG. 8, a wiring sequence of N first clock signal lines CLK1~CLKN along the first direction may sequentially be: a first first clock signal line CLK1, a N-th first clock signal line CLKN, a second first clock signal line CLK2, a (N−1)-th first clock signal line CLK(N−1), a third first clock signal line CLK3, . . . , $a\left(\frac{N+1}{2}-1\right)$-th first clock signal line $CLK\left(\frac{N+1}{2}-1\right)$, $a\left(\frac{N+1}{2}+1\right)$-th first clock signal line $CLK\left(\frac{N+1}{2}+1\right)$, and $a\left(\frac{N+1}{2}\right)$-th first clock signal line $CLK\left(\frac{N+1}{2}\right)$.

Illustratively, when N is 5, a wiring sequence of five first clock signal lines along the first direction may sequentially be: a first first clock signal line CLK1, a second first clock signal line CLK2, a fifth first clock signal line CLK5, a third first clock signal line CLK3, and a fourth first clock signal line CLK4; or, a wiring sequence of five first clock signal lines along the first direction may sequentially be: a first first clock signal line CLK1, a fifth first clock signal line CLK5, a second first clock signal line CLK2, a fourth first clock signal line CLK4, and a third first clock signal line CLK3.

When N is 7, a wiring sequence of seven first clock signal lines along the first direction may sequentially be: a first first clock signal line CLK1, a second first clock signal line CLK2, a seventh first clock signal line CLK7, a third first clock signal line CLK3, a sixth first clock signal line CLK6, a fourth first clock signal line CLK4, and a fifth first clock signal line CLK5; or, a wiring sequence of seven first clock signal lines along the first direction may sequentially be: a first first clock signal line CLK1, a seventh first clock signal line CLK7, a second first clock signal line CLK2, a sixth first clock signal line CLK6, a third first clock signal line CLK3, a fifth first clock signal line CLK5, and a fourth first clock signal line CLK4.

When N is 9, a wiring sequence of nine first clock signal lines along the first direction may sequentially be: a first first clock signal line CLK1, a second first clock signal line CLK2, a ninth first clock signal line CLK9, a third first clock signal line CLK3, an eighth first clock signal line CLK8, a fourth first clock signal line CLK4, a seventh first clock signal line CLK7, a fifth first clock signal line CLK5, and a sixth first clock signal line CLK6; or, a wiring sequence of nine first clock signal lines along the first direction may sequentially be: a first first clock signal line CLK1, a ninth first clock signal line CLK9, a second first clock signal line CLK2, an eighth first clock signal line CLK8, a third first clock signal line CLK3, a seventh first clock signal line CLK7, a fourth first clock signal line CLK4, a sixth first clock signal line CLK6, and a fifth first clock signal line CLK5.

Figure 9:
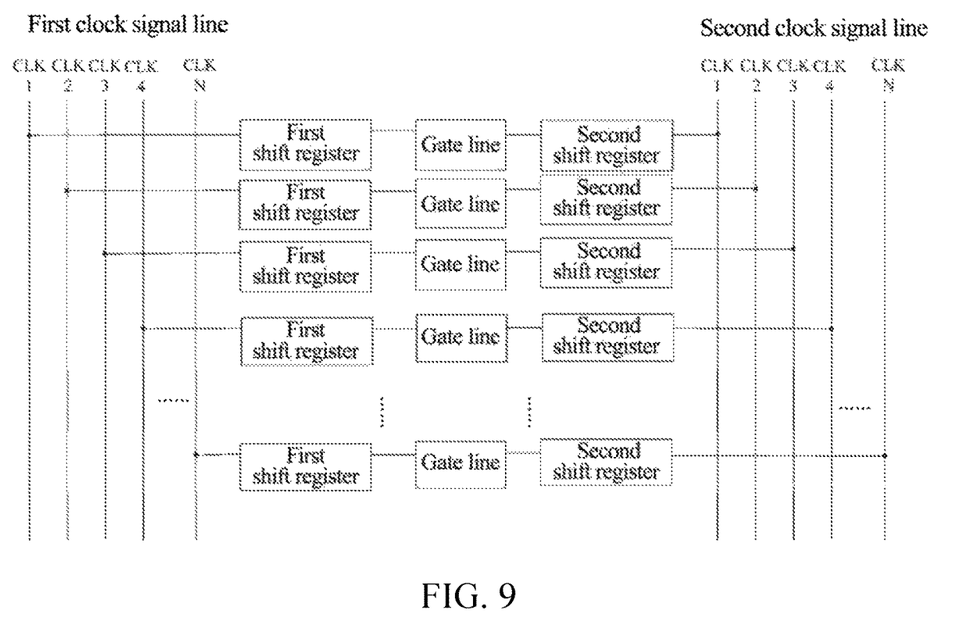
FIG. 9 is a seventh schematic diagram of clock signal line wiring of a display substrate according to an embodiment of the present disclosure.

As shown in FIG. 9, in another exemplary embodiment, each group of shift registers includes: a first shift register and a second shift register, and each group of clock signal lines includes: a first clock signal line and a second clock signal line. N first clock signal lines are positioned on one side of M first shift registers away from a display area, adjacent N first shift registers are connected with the N first clock signal lines one by one correspondingly. N second clock signal lines are positioned on one side of M second shift registers away from the display area, adjacent N second shift registers are connected with N second clock signal lines one by one correspondingly, and the first shift register and the second shift register in the same group of shift registers are connected to a same group of gate lines.

A wiring sequence of the N first clock signal lines and the N second clock signal lines satisfies that a sum of impedances of the first clock signal line and the second clock signal line connected to each group of shift registers is equal to $(N-1)*\Delta R+2*R1$, R1 is an impedance value of a clock signal line closest to the first shift register or the second shift register.

For middle/large-size FPD products, due to a larger load on gate lines, generally shift registers adopt double-side driving to normally turn on the gate lines, that is, for a row of gate lines, there is a shift register on either of the left and right sides to charge them. In this case, the left shift register and the right shift register are designed to be completely symmetrical, which is called double-side driving.

In an embodiment, signals of the first clock signal line and the second clock signal line in a same group of clock signal lines are same.

In an exemplary embodiment, as shown in FIG. 9, a wiring sequence of N first clock signal lines and N second clock signal lines may be: the N first clock signal lines and the N second clock signal lines are respectively positioned in non-display areas on opposite sides of a display area; the N first clock signal lines are sequentially wired in turn from a direction away from the display area to a direction close to the display area according to a first first clock signal line to a N-th first clock signal line, and the N second clock signal lines are sequentially wired in turn from a direction close to the display area to a direction away from the display area according to the first second clock signal line to the N-th second clock signal line.

Figure 10:
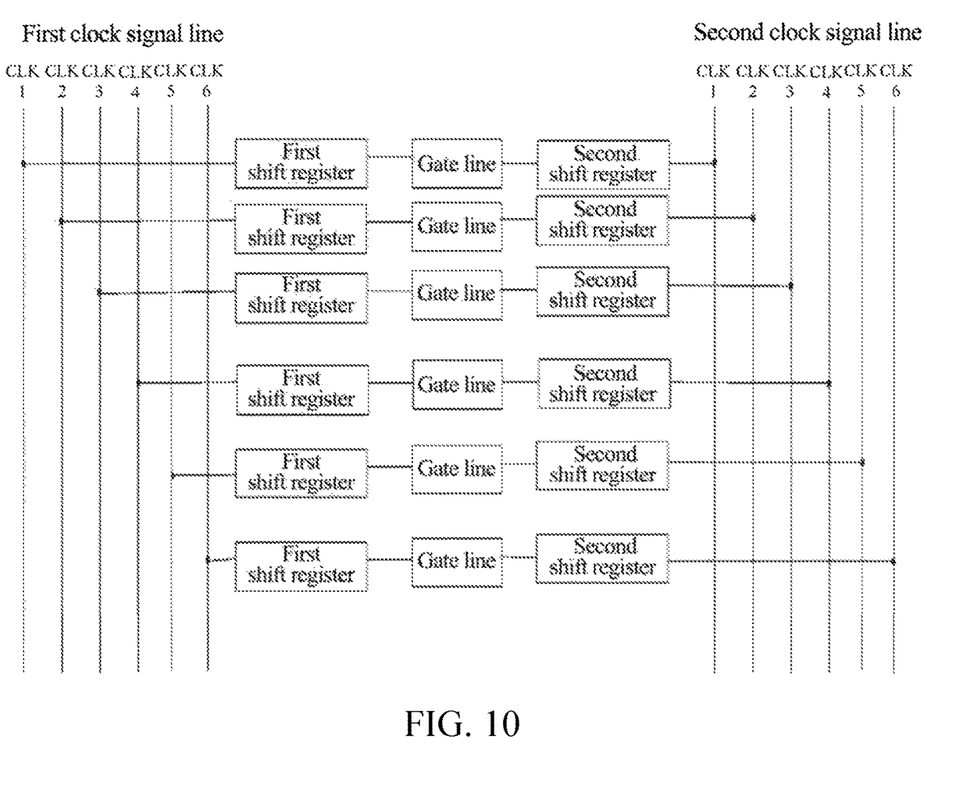
FIG. 10 is an eighth schematic diagram of clock signal line wiring of a display substrate according to an embodiment of the present disclosure.

Illustratively, when N is 6, a wiring sequence of six first clock signal lines and six second clock signal lines is shown in FIG. 10.

By setting shift registers with double-ended offset and CLK signal lines asymmetrically arranged on left and right, a value of every line after addition of $\Delta Vp1$ generated at a left end and $\Delta Vp2$ generated at a right end is almost the same, thus a brightness difference between rows may be improved.

An embodiment of the present disclosure further provides a display apparatus, and the display apparatus includes the display substrate provided in any of the aforementioned embodiments.

According to the embodiments of the present disclosure, by unconventional arrangement of the clock signal lines CLKs, a resistance difference of clock signal lines CLKs between rows is reduced and controlled within a controllable range, or falling edges of the overall gate lines are completely consistent by using asymmetric arrangement of two ends, so that a problem of periodic horizontal stripes caused by a difference between output clock signal lines CLKs is solved.

The accompanying drawings in the embodiments of the present disclosure only refer to structures involved in the embodiments of the present disclosure, and other structures may refer to common designs.

Without conflict, the embodiments of the present disclosure and the features in the embodiments may be combined with each other to obtain a new embodiment.

Although the embodiments disclosed in the present disclosure are as the above, the described contents are only implementations for facilitating understanding the present disclosure and are not used to limit the present disclosure. Any person skilled in the field to which the present disclosure pertains may make any modifications and variations in the forms and details of implementation without departing from the spirit and the scope disclosed in the present disclosure, but the patent protection scope of the present disclosure should still be subject to the scope defined by the appended claims.

What is claimed is:

1. A display substrate, comprising a display area and a peripheral area, wherein the display substrate comprises M groups of shift registers and N groups of clock signal lines in the peripheral area, M is greater than or equal to N, M and N are positive integers, each group of shift registers is connected with a group of gate lines positioned in the display area, and adjacent N groups of shift registers are connected with N groups of clock signal lines one by one correspondingly;

the N groups of clock signal lines are disposed side by side along a first direction, and the N groups of clock signal lines are configured to make, through an adjustment of a wiring sequence, an impedance difference between two groups of clock signal lines connected to any two adjacent groups of shift registers be less than or equal to an impedance threshold value, wherein each group of shift registers comprises a first shift register and a second shift register, and each group of clock signal lines comprises a first clock signal line and a second clock signal line; N first clock signal lines are positioned on one side of the M first shift registers away from the display area, adjacent N first shift registers are connected with the N first clock signal lines one by one correspondingly; N second clock signal lines are positioned on one side of the M second shift registers away from the display area, adjacent N second shift registers are connected with the N second clock signal lines one by one correspondingly, and the first shift register and the second shift register in the same group of shift registers are connected to a same group of gate lines;

a wiring sequence of the N first clock signal lines and the N second clock signal lines satisfies that a sum of impedances of the first clock signal line and the second clock signal line connected to each group of shift registers is equal to $(N-1)*\Delta R+2*R1$, wherein R1 is an impedance value of a clock signal line closest to the first shift register or the second shift register, and ΔR is an impedance difference between two groups of clock signal lines connected to two adjacent groups of shift registers.

2. The display substrate according to claim 1, wherein signals of the first clock signal line and the second clock signal line in a same group of clock signal lines are same.

3. The display substrate according to claim 1, wherein a wiring sequence of the N first clock signal lines and the N second clock signal lines is:

the N first clock signal lines and the N second clock signal lines are respectively positioned in peripheral areas on opposite sides of the display area;

the N first clock signal lines are sequentially wired in turn from a direction away from the display area to a direction close to the display area according to the first first clock signal line to the N-th first clock signal line, and the N second clock signal lines are sequentially wired in turn from a direction close to the display area to a direction away from the display area according to the first second clock signal line to the N-th second clock signal line.

4. A display apparatus, comprising a display substrate, wherein the display substrate comprises a display area and a peripheral area, the display substrate comprises M groups of shift registers and N groups of clock signal lines in the peripheral area, M is greater than or equal to N, M and N are positive integers, each group of shift registers is connected with a group of gate lines positioned in the display area, and adjacent N groups of shift registers are connected with N groups of clock signal lines one by one correspondingly;

the N groups of clock signal lines are disposed side by side along a first direction, and the N groups of clock signal lines are configured to make, through an adjustment of a wiring sequence, an impedance difference between two groups of clock signal lines connected to any two adjacent groups of shift registers be less than or equal to an impedance threshold value, wherein each group of shift registers comprises a first shift register and a second shift register, and each group of clock signal lines comprises a first clock signal line and a second clock signal line; N first clock signal lines are positioned on one side of the M first shift registers away from the display area, adjacent N first shift registers are connected with the N first clock signal lines one by one correspondingly; N second clock signal lines are positioned on one side of the M second shift registers away from the display area, adjacent N second shift registers are connected with the N second clock signal lines one by one correspondingly, and the first shift register and the second shift register in the same group of shift registers are connected to a same group of gate lines;

a wiring sequence of the N first clock signal lines and the N second clock signal lines satisfies that a sum of impedances of the first clock signal line and the second clock signal line connected to each group of shift registers is equal to $(N-1)*\Delta R+2*R1$, wherein R1 is an impedance value of a clock signal line closest to the first shift register or the second shift register, and ΔR is an impedance difference between two groups of clock signal lines connected to two adjacent groups of shift registers.

5. The display apparatus according to claim 4, wherein signals of the first clock signal line and the second clock signal line in a same group of clock signal lines are same.

6. The display apparatus according to claim 4, wherein a wiring sequence of the N first clock signal lines and the N second clock signal lines is:

the N first clock signal lines and the N second clock signal lines are respectively positioned in non-display areas on opposite sides of the display area;

the N first clock signal lines are sequentially wired in turn from a direction away from the display area to a direction close to the display area according to the first first clock signal line to the N-th first clock signal line, and the N second clock signal lines are sequentially wired in turn from a direction close to the display area to a direction away from the display area according to the first second clock signal line to the N-th second clock signal line.

* * * * *